(12) United States Patent
Joo

(10) Patent No.: US 6,943,075 B2
(45) Date of Patent: Sep. 13, 2005

(54) METHOD FOR MANUFACTURING FLASH MEMORY DEVICE

(75) Inventor: Kwang Chul Joo, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/883,414

(22) Filed: Jun. 30, 2004

(65) Prior Publication Data

US 2005/0142765 A1 Jun. 30, 2005

(30) Foreign Application Priority Data

Dec. 30, 2003 (KR) .................. 10-2003-0100170

(51) Int. Cl.[7] ................................ H01L 21/8238
(52) U.S. Cl. .................. 438/211; 438/257; 438/264; 438/424
(58) Field of Search ............... 438/211, 257, 264, 438/424, FOR 221, FOR 227

(56) References Cited

U.S. PATENT DOCUMENTS

| | | | | |
|---|---|---|---|---|
| 6,140,182 | A * | 10/2000 | Chen | 438/259 |
| 6,699,772 | B1 * | 3/2004 | Sharma | 438/424 |
| 6,709,924 | B1 * | 3/2004 | Yu et al. | 438/257 |
| 6,743,676 | B2 * | 6/2004 | Park et al. | 438/257 |
| 6,818,508 | B2 * | 11/2004 | Shimizu et al. | 438/257 |
| 6,818,511 | B2 * | 11/2004 | Lee | 438/266 |
| 6,867,098 | B2 * | 3/2005 | Park et al. | 438/257 |
| 2003/0119257 | A1 * | 6/2003 | Dong et al. | 438/257 |
| 2003/0199149 | A1 * | 10/2003 | Lee et al. | 438/424 |
| 2003/0203594 | A1 * | 10/2003 | Shimizu et al. | 438/424 |
| 2004/0087086 | A1 * | 5/2004 | Lee | 438/257 |
| 2004/0102005 | A1 * | 5/2004 | Dong et al. | 438/257 |

* cited by examiner

*Primary Examiner*—George Fourson
*Assistant Examiner*—Michelle Estrada
(74) *Attorney, Agent, or Firm*—Marshall, Gerstein & Borun LLP

(57) ABSTRACT

The present invention relates to a method for manufacturing a flash memory device. A polysilicon layer for a floating gate has a stack structure of a doped polysilicon layer and an undoped polysilicon layer, whereby the polysilicon layer is prevented from being oxidized at the interface of the polysilicon layer and a dielectric layer in the process of forming the dielectric layer or in other subsequent process. Furthermore, an oxidization-resistant property of a polysilicon layer can be further increased by nitrifying the surface of the polysilicon layer for a floating gate before a dielectric layer is formed. Thereby, the interfacial characteristics of the polysilicon layer and the dielectric layer can be improved and the layer quality of the dielectric layer can be improved while preventing the edge of the dielectric layer from becoming thick.

16 Claims, 5 Drawing Sheets

METHOD FOR MANUFACTURING FLASH MEMORY DEVICE

BACKGROUND

1. Field of the Invention

The present invention relates to a method for manufacturing a flash memory device, and more specifically, to a method for manufacturing a flash memory device which can improve the interfacial characteristics of a floating gate and a dielectric layer.

2. Discussion of Related Art

Recently, in implementing DATA Flash devices, an isolation layer is formed by means of a self-aligned shallow trench isolation (SA-STI) process. The SA-STI process can be explained in short as follows. A tunnel oxide layer, a first polysilicon layer and a pad nitride layer are sequentially formed. The pad nitride layer, the first polysilicon layer and the tunnel oxide layer in the isolation region are then etched and etch is performed up to a semiconductor substrate, thereby forming a trench. The trench is then buried with an insulating material to form an isolation layer of a STI structure.

Thereafter, a second polysilicon layer into which an impurity is doped is formed on the entire structure. A portion of the second polysilicon layer on the isolation layer is etched. An ONO dielectric layer, a third polysilicon layer and a silicide layer are sequentially formed on the entire structure including the second polysilicon layer. A patterning process is then performed by means of an etch process using a control gate mask. A floating gate having the first and second polysilicon layers is thus formed and a control gate having the third polysilicon layer is formed, thereby completing a flash memory cell.

In the above, the ONO dielectric layer has a stack structure of a first oxide layer/a nitride layer/a second oxide layer, wherein the oxide layer is formed using DCS-HTO. At this time, in the process of loading a semiconductor substrate into a boat of a high temperature in order to form the first oxide layer, an irregular oxide layer is formed at the interface of the second polysilicon layer. Meanwhile, after the ONO dielectric layer is formed, a high-temperature annealing process is implemented in a wet oxidation mode at a temperature of 750° C. or more in order to remove the causes of the leakage current such as the density and pin-hole of the dielectric layer. The second polysilicon layer is oxidized at the interface of the first oxide layer and the second polysilicon layer due to the annealing process of the high temperature, making the dielectric layer irregular.

Furthermore, in order to form the control gate, an etch process is carried out after the third polysilicon layer is formed. In order to mitigate the etch stress generated at the sidewall of the third polysilicon layer exposed by the etch process, an annealing process is performed as a subsequent process at a high temperature of 800° C. In this case, in order to increase the effect of the annealing process, the sidewall of the third polysilicon layer is oxidized in a predetermined thickness. In this process, the oxide layer is formed at the interface of the oxide layer and the polysilicon layer. For this reason, there occurs a difference between the effective oxide layer thickness (Teff) of the dielectric layer inside the gate and the effective oxide layer thickness of the gate sidewall, thus making the effective oxide layer thickness irregular. Moreover, the effective oxide layer thickness is increased since the dielectric layer becomes thick, which reduces capacitance. Furthermore, such irregular oxidization acts as the cause of the leakage current and also lowers the breakdown voltage, which adversely affects the operation of the cell.

SUMMARY OF THE INVENTION

The present invention is directed to a method for manufacturing a flash memory device wherein a polysilicon layer for a floating gate has a stack structure of a doped polysilicon layer and an undoped polysilicon layer, whereby the polysilicon layer is prevented from being oxidized at the interface of the polysilicon layer and a dielectric layer in the process of forming the dielectric layer or in a subsequent process.

Furthermore, another object of the present invention is to further increase the oxidization-resistant properties of a polysilicon layer for a floating gate by nitrifying the surface of the polysilicon layer before a dielectric layer is formed.

According to the present invention, the interfacial characteristics of the polysilicon layer and the dielectric layer can be improved and the layer quality of the dielectric layer can be improved, while preventing the edge of the dielectric layer from becoming thick.

According to a method for manufacturing a flash memory device, before a silicon layer for a floating gate and a dielectric layer are formed, an anti-oxidization layer is formed on the entire surface of the silicon layer.

In the above, the bottom of the silicon layer is composed of a doped silicon layer and the top of the silicon layer is composed of an undoped silicon layer.

According to another aspect of the present invention, there is provided a method for manufacturing a flash memory device, comprising the steps of forming a tunnel oxide layer, a first silicon layer and a pad nitride layer through which an isolation region of a semiconductor substrate is exposed in a stack structure; forming a trench in the isolation region; forming an insulating material layer on the entire structure and then stripping the insulating material layer on the pad nitride layer, thus forming an isolation layer in the trench; stripping the pad nitride layer; forming a second silicon layer whose bottom is composed of a doped silicon layer and top is composed of an undoped silicon layer on the entire structure; patterning the second silicon layer so that the central portion of the isolation layer is exposed and the edge of the isolation layer is overlapped with the isolation layer; forming an anti-oxidization layer on the entire surface of the second silicon layer; sequentially forming a dielectric layer, a third silicon layer and a silicide layer on the entire structure including the second silicon layer; and patterning the silicide layer and the second silicon layer by means of an etch process using a control gate mask to form a control gate, and then patterning the first and second silicon layers by means of a self-aligned etch process to form a floating gate.

In the above, the first silicon layer can be composed of an undoped amorphous silicon layer or a polysilicon layer. In this case, the first silicon layer can be formed by means of a low pressure chemical vapor deposition (LP-CVD) method using $SiH_4$ as a source gas at a temperature of 450° C. to 600° C. and a low pressure of 0.1 Torr to 3 Torr.

The method may further comprise the steps of, before the insulating material layer is formed after the trench is formed, implementing a hydrogen annealing process to make the top and bottom edges of the trench rounded; implementing a cleaning process to strip the exposed side of the tunnel oxide layer as much as a target amount, while stripping a native oxide layer formed on the sidewall and bottom of the trench, thus controlling a channel width; and forming a liner oxide layer composed of a HTO thin layer on the entire structure in order to protect the exposed side of the tunnel oxide layer.

At this time, the hydrogen annealing process is performed in a rapid thermal mode at a temperature ranging from 600° C. to 1050° C. and a low pressure ranging from 50 Torr to 380 Torr, wherein hydrogen of 100 sccm to 2000 sccm is supplied.

The doped silicon layer can be formed by means of a LP-CVD method using $SiH_4$ or $Si_2H_6$ and a $PH_3$ gas at a temperature of 480° C. to 620° C. and a pressure of 0.1 to 3 Torr.

The undoped silicon layer is formed using $SiH_4$ or $Si_2H6$ and can be formed by means of a LP-CVD method at a temperature of 510° C. to 550° C. and a pressure of 0.1 Torr to 3 Torr. Further, the undoped silicon layer can be formed in an in-situ mode wherein only an additive gas for doping an impurity is precluded without breaking vacuum in the same chamber, if the doped silicon layer is formed in a target thickness while the doped silicon layer is formed.

Meanwhile, it is preferred that the doped silicon layer is formed thicker 4 to 9 times than the undoped silicon layer.

The step of forming the second silicon layer comprises the steps of forming a capping nitride layer on the entire structure; patterning the capping nitride layer so that the second silicon layer on the isolation layer is exposed; forming a spacer nitride layer on the sidewall of the capping nitride layer on the exposed second silicon layer; stripping the second silicon layer in the exposed region; and stripping the spacer nitride layer and the capping nitride layer.

The anti-oxidization layer can be formed using a nitride material and the anti-oxidization layer can be formed by nitrifying the surface of the second silicon layer.

The nitrification process can be performed in a mode wherein the surface of the second silicon layer is nitrified in-situ or ex-situ using plasma under a $NH_3$ atmosphere or $N_2/H_2$ atmosphere at a temperature of 200° C. to 500° C. for 1 to 10 minutes after the second silicon layer is formed.

The nitrification process can be performed in a mode wherein annealing is performed under a $NH_3$ atmosphere at a temperature ranging from 700° C. to 900° C. by means of a rapid thermal process.

The nitrification process can be performed in a furnace of a NH3 atmosphere at a temperature of 550° C. to 800° C.

It is preferred that when the semiconductor substrate is loaded into a boat in order to form the dielectric layer, a boat loading temperature is in range of room temperature to 300° C.

DETAILED DESCRIPTION OF PREFERRED EMBODIMENTS

Figure 1A:
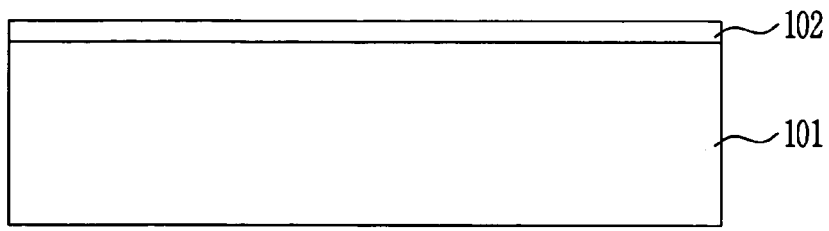
FIG. 1A to FIG. 1M are cross-sectional views shown to explain a method for manufacturing a flash memory device according to an embodiment of the present invention.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one layer is "on" the other layer or a semiconductor substrate, the one layer may directly contact the other layer or the semiconductor substrate. Or, a third layer may be intervened between the one layer and the other layer or the semiconductor substrate. Further, in the drawing, the thickness and size of each layer are exaggerated for convenience of explanation and clarity. Like reference numerals are used to identify the same or similar parts.

FIG. 1A to FIG. 1M are cross-sectional views shown to explain a method for manufacturing a flash memory device according to an embodiment of the present invention.

Referring to FIG. 1A, a screen oxide layer 102 is formed on a semiconductor substrate 101. An ion implantation process for controlling the threshold voltage of elements (for example, transistors or flash memory cells) that will be formed in the semiconductor substrate or forming a well (not shown) is then performed.

The screen oxide layer 102 is formed 50 Å to 70 Å in thickness and is formed by means of the dry oxidization method or wet oxidization method at a temperature ranging from 750° C. to 800° C.

Meanwhile, before the screen oxide layer 102 is formed, a cleaning process can be performed. In this case, the cleaning process can be implemented by sequentially using diluted HF in which $H_2O$:HF are mixed in the ratio of 50: 1 to 100:1 and a SC-1($NH_4OH/H_2O_2/H_2O$) solution, or using sequentially BOE (Buffered Oxide Etchant) in which a solution where $NH_4F$:HF are mixed in the ratio of 4:1 to 7:1 is diluted into $H_2O$ in the ratio of 1:100 to 1:300 and a SC-1($NH_4OH/H_2O_2/H_2O$) solution.

Figure 1B:
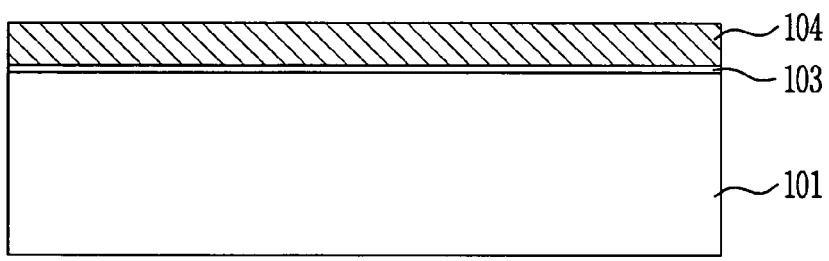

Referring to FIG. 1B, the screen oxide layer (102 in FIG. 1A) is stripped. A tunnel oxide layer 103 and a first silicon layer 104 are then sequentially formed on the entire structure of the semiconductor substrate 101.

In the above, the screen oxide layer (102 in FIG. 1A) is stripped by means of a cleaning process that sequentially uses diluted HF in which $H_2O$:HF are mixed in the ratio of 50:1 to 100:1 and a SC-1($NH_4OH/H_2O_2/H_2O$) solution.

Meanwhile, the tunnel oxide layer 103 is formed by means of the wet oxidization method at a temperature of 750° C. to 800° C. and is annealed under a nitrogen atmosphere at a temperature of 900° C. to 910° C. for 20 to 30 minutes, thereby minimizing the interfacial defect density between the semiconductor substrate 101 and the tunnel oxide layer 103. The first silicon layer 104 is formed using an undoped amorphous silicon layer or a polysilicon layer and is formed 250 Å to 500 Å in thickness by means of a low pressure chemical vapor deposition (LP-CVD) method using $SiH_4$ as a source gas at a temperature of 450° C. to 600° C. and a low pressure condition of 0.1 Torr to 3 Torr.

Figure 1C:
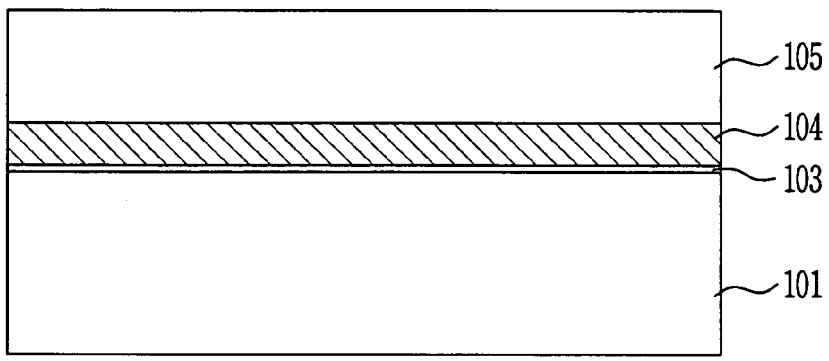

By reference to FIG. 1C, a pad nitride layer 105 is formed on the first silicon layer 104. The pad nitride layer 105 is formed 900 Å to 1500 Å in thickness by means of the LP-CVD method.

Figure 1D:
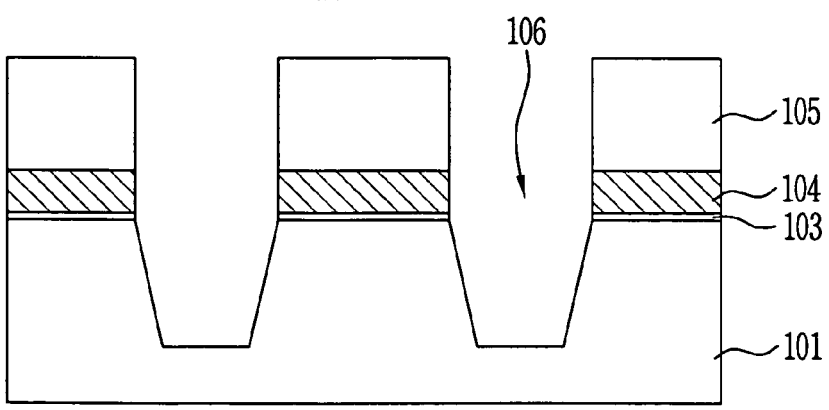

With reference to FIG. 1D, the pad nitride layer 105, the first silicon layer 104 and the tunnel oxide layer 103 are sequentially etched by means of an etch process using an isolation mask, so that the isolation region of the semiconductor substrate 101 is exposed. Thus the tunnel oxide layer 103, the first silicon layer 104 and the pad nitride layer 105 that expose the isolation region of the semiconductor substrate 101 have a stack structure, while the first silicon layer 104 for forming a floating gate is isolated.

Thereafter, the semiconductor substrate 101 of the exposed isolation region is etched up to a predetermined depth, forming a trench 106. The sidewall of the trench 106 is formed to have a tilt angle of 75° to 85°.

Figure 1E:
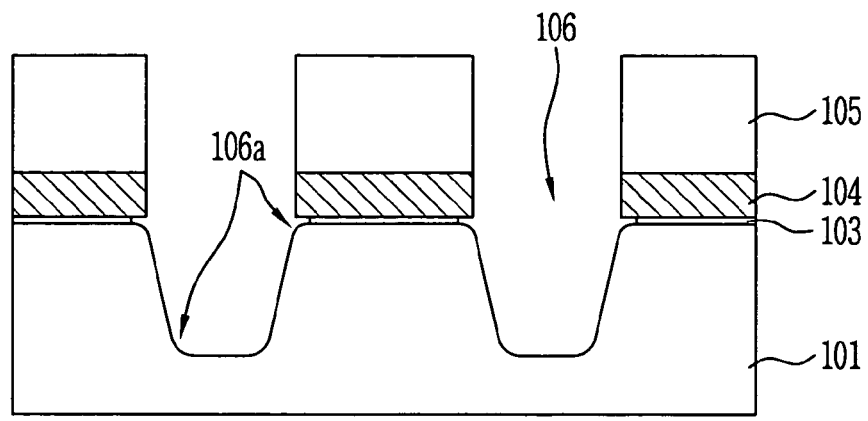

Referring to FIG. 1E, in order to allow the sidewall and bottom edge 106a of the trench to be rounded, a hydrogen annealing process is performed in the rapid thermal process (RTP) (or Fast Thermal Process (FTP)) apparatus. If the hydrogen annealing process is performed, the sidewall and bottom edge 106a of the trench are made rounded by a Si atomic migration phenomenon.

The RTP annealing process using hydrogen is performed at a temperature ranging from 600° C. to 1050° C. and a low pressure ranging from 50 Torr to 380 Torr for 1 to 10 minutes, while supplying hydrogen of 100 sccm to 2000 sccm.

Figure 1F:
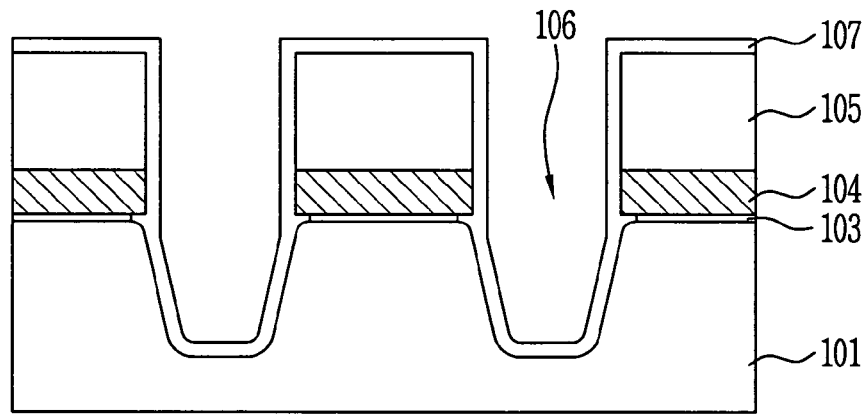

By reference to FIG. 1F, a liner oxide layer 107 is formed on the entire structure including the sidewall and bottom of the trench 106. The liner oxide layer 107 is formed so as to prevent the edges of the tunnel oxide layer 103 from being damaged by a subsequent process. Such a liner oxide layer 107 is formed using a HTO (Hot Temperature Oxide) thin layer using DCS($SiH_2Cl_2$) as a source gas. Further, the liner oxide layer 107 is formed 100 Å to 200 Å in thickness by means of the LP-CVD method in a chamber of 800° C. to 830° C. in temperature and of 0.1 Torr to 1 Torr in pressure. After the liner oxide layer 107 is formed, an annealing process is performed under a nitrogen atmosphere so that the layer quality of the oxide layer 107 becomes dense. Such annealing of the nitrogen atmosphere is carried out at a temperature of 1000° C. to 1100° C. for 20 to 30 minutes.

Meanwhile, before the liner oxide layer 107 is formed, a cleaning process can be performed in order to strip a native oxide layer (not shown) formed on the sidewall and bottom of the trench 106. Further, during the cleaning process, the channel width of the flash memory cell can be reduced or minimized by stripping the exposed edge portion of the tunnel oxide layer 103 as much as a desired degree. Such a cleaning process can be performed by sequentially using diluted HF in which $H_2O$:HF are mixed in the ratio of 50:1 to 100:1 and a SC-1($NH_4OH/H_2O_2/H_2O$) solution, or using sequentially BOE (Buffered Oxide Etchant) in which a solution where $NH_4F$:HF are mixed in the ratio of 4:1 to 7:1 is diluted into $H_2O$ in the ratio of 1:100 to 1:300 and a SC-1($NH_4OH/H_2O_2/H_2O$) solution.

Figure 1G:
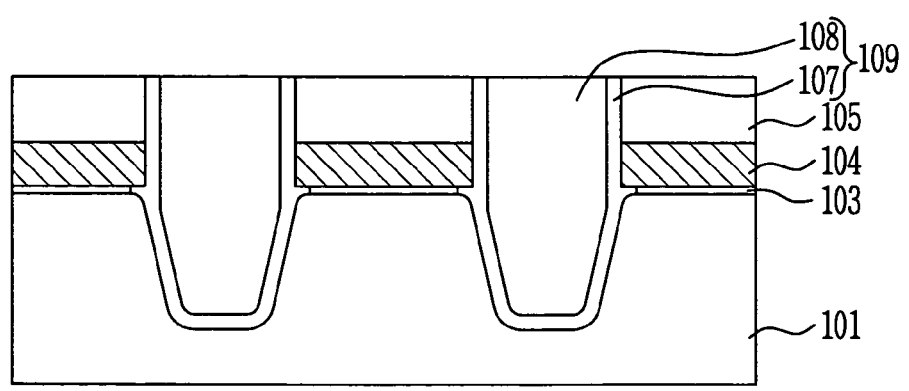

By reference to FIG. 1G, an insulating material layer (not shown) is formed on the entire structure so that the space among the tunnel oxide layer 103, the first silicon layer 104 and the pad nitride layer 105 and the trench (106 in FIG. 1F) is completely buried. In this case, the insulating material layer is formed in thickness of 4000 Å to 10000 Å using a high density plasma (HDP) oxide layer.

After the insulating material layer is formed, a chemical mechanical polishing process is implemented to strip the insulating material layer on the pad nitride layer 105. In this case, the chemical mechanical polishing process is performed so that the liner oxide layer 107 on the pad nitride layer 105 and some of the pad nitride layer 105 as well as the insulating material layer are stripped, so that the pad nitride layer 105 remains in a target thickness. Due to this, the insulating material layer remains only in the trench (106 in FIG. 1F) and the space among the tunnel oxide layer 103, the first silicon layer 104 and the pad nitride layer 105 on the trench (106 FIG. 1F). An isolation layer 109 having the liner oxide layer 107 and an insulating material 108 is thus formed. That is, the isolation layer 109 is composed of the liner oxide layer 107 and the high-density plasma oxide layer 108.

The height of the isolation layer 109 that remains higher than the surface of the semiconductor substrate 101 is decided depending on a thickness of the remaining pad nitride layer 105 after the pad nitride layer 105 is completely stripped in a subsequent process. Further, the shape and surface area of a second silicon layer (not shown), which will be formed on the first silicon layer 104 and the isolation layer 109, are decided depending on the height of the projected isolation layer 109. Thus the pad nitride layer 105 is made to remain in an adequate thickness considering the two facts.

Figure 1H:
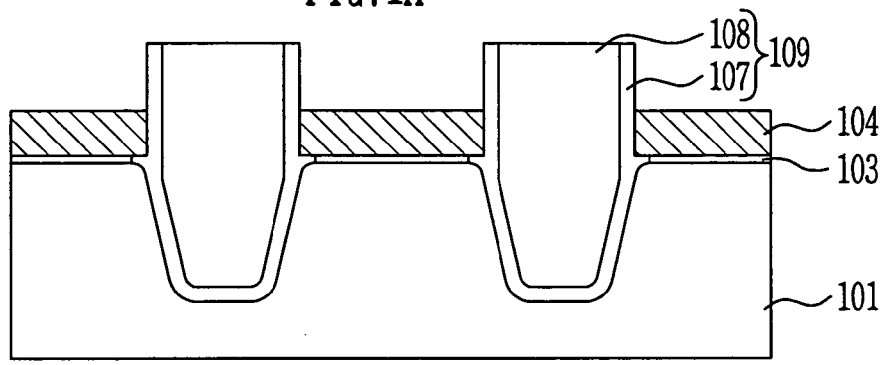

Referring to FIG. 1H, the pad nitride layer (105 in FIG. 1G) is completely stripped. In this case, a portion of the liner oxide layer that is exposed as the pad nitride layer is stripped can be stripped. The surface of the first silicon layer 104 is thus exposed. The pad nitride layer (105 in FIG. 1G) is stripped using a phosphoric acid ($H_3PO_4$).

Figure 1I:
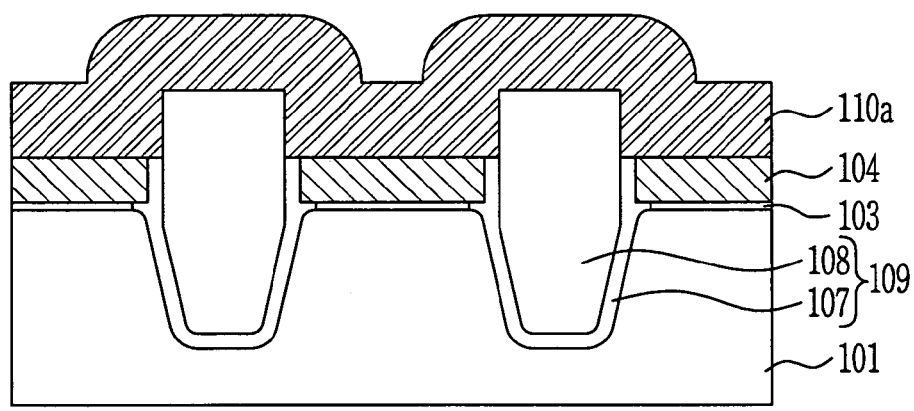

By reference to FIG. 1I, a doped silicon layer 110a is formed on the entire structure.

The doped silicon layer 110a is formed using a polysilicon layer into which phosphor (P) is doped (doped poly-Si) by means of the LP-CVD method using $SiH_4$ or $Si_2H_6$ and a $PH_3$ gas at a temperature of 480° C. to 620° C. and a pressure of 0.1 to 3 Torr. The doped silicon layer 110a is formed not only on the isolation layer 109 but also on the first silicon layer 104 between the isolation layers 109. The doped silicon layer 110a is thus formed in thickness of 400 Å to 1000 Å in a rugged shape within a range that can maximize the coupling ratio.

Meanwhile, before the doped silicon layer 110a is formed, in order to strip the native oxide layer on the surface of the first silicon layer 104 exposed after the pad nitride layer (105 in FIG. 1G) is stripped and to minimize the interfacial effect between the first and doped silicon layers 104 and 110a, a cleaning process can be performed. The cleaning process is performed in a wet cleaning mode using diluted HF. It is preferred that a delay time until the second silicon layer 110a is deposited after the cleaning process is performed is within 2 hours.

Figure 1J:
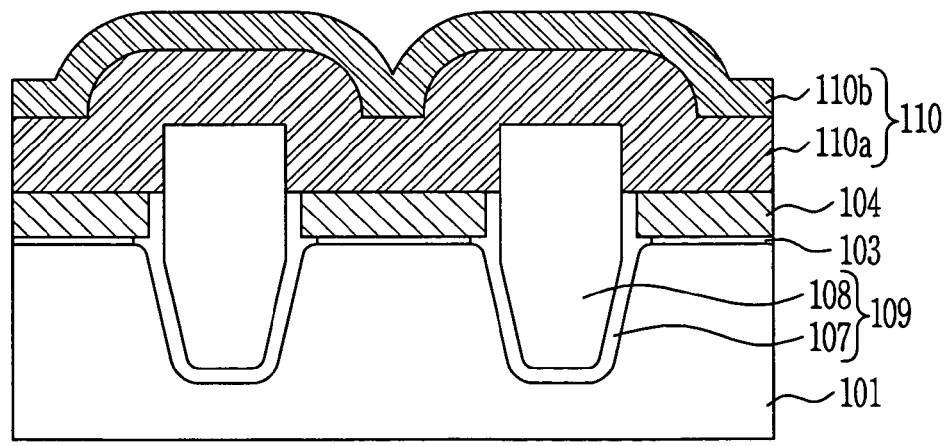

Referring to FIG. 1J, an undoped silicon layer 110b is formed on the doped silicon layer 110a. The second silicon layer 110 having a stack structure of the doped silicon layer 110a and the undoped silicon layer 10b is thus completed.

In the above, the undoped silicon layer 110b is formed using undoped amorphous silicon. The undoped silicon layer 110b serves as a capping silicon layer that prevents a native oxide layer from being irregularly grown, which is formed by a $N_2O$ gas during the process of forming a lower oxide layer of an ONO structure on the undoped silicon layer 10b when the dielectric layer is formed to have the ONO structure in a subsequent process. In other words, the top of the second silicon layer 110 is formed using the undoped silicon layer by using a characteristic that silicon not containing an impurity is less oxidized than silicon containing an impurity. It is thus possible to prevent the top of the second silicon layer 110 coming in contact with the dielectric layer from being oxidized during the process of forming the lower oxide layer of the dielectric layer in a subsequent process or performing a subsequent annealing process after the dielectric layer is formed.

Such undoped silicon layer 110b can be formed by means of the LP-CVD method using $SiH_4$ or $Si_2H_6$ at a temperature of 510° C. to 550° C. and a pressure of 0.1 Torr to 3 Torr. It is preferable that the undoped silicon layer 10b is formed in thickness of 10% to 20% of the thickness of the second silicon layer 110. For instance, the undoped silicon layer 110b can be formed 100 Å to 300 Å in thickness.

Like when the doped silicon layer 100a is formed on the first silicon layer 104 in FIG. 1I, a cleaning process can be formed in order to strip the native oxide layer on the surface of the doped silicon layer 10a and to minimize the interfacial effect between the doped silicon layer and the undoped silicon layers 110a and 10b before the undoped silicon layer 110b is formed. The cleaning process is performed in the wet cleaning mode using diluted HF. It is preferred that a delay time until the undoped silicon layer 110b is deposited after the cleaning process is performed is within 2 hours.

Meanwhile, the undoped silicon layer 110b can be formed in an in-situ mode after the doped silicon layer 10a is formed. In more detail, if the doped silicon layer 110a is formed in a target thickness while the doped silicon layer 10a is formed, the undoped silicon layer 110b can be formed by precluding only supply of an additive gas (for example, $PH_3$) for doping an impurity without breaking vacuum in the same chamber. In this case, it is possible to omit the cleaning process performed after the doped silicon layer 110a is formed.

Figure 1K:
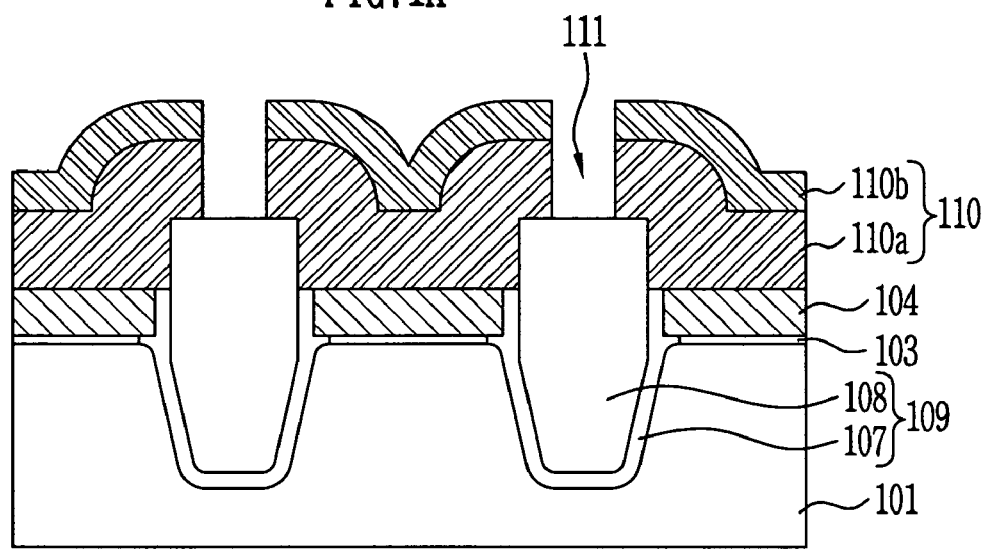

By reference to FIG. 1K, the second silicon layer 110 formed on the top center of the isolation layer 109 is stripped so that the top center of the isolation layer 109 is exposed while the second silicon layer 100 is overlapped with the edge of the isolation layer 109. Thereby, the second silicon layer 110 is isolated in a width narrower than the width of the isolation layer 109 while an opening 111 is formed in the top center of the isolation layer 109.

In the concrete, a capping nitride layer (not shown) is formed on the second silicon layer 110. The capping nitride layer (not shown) at a predetermined region on the isolation layer 109 is stripped by means of an etch process using a floating gate mask, thereby exposing the second silicon layer 110. A nitride layer (not shown) for a spacer is then formed on the entire structure. The nitride layer for the spacer is left only on the sidewall of the capping nitride layer (not shown) by means of a blanket etch process, forming a spacer nitride layer (not shown) only on the sidewall of the capping nitride layer (not shown). As the spacer nitride layer (not shown) is formed, the exposed region of the second silicon layer 110 becomes narrow. Thereafter, the exposed region of the second silicon layer 110 is stripped by means of an etch process using the capping nitride layer (not shown) and the spacer nitride layer (not shown) as an etch mask. As the second silicon layer 110 is etched, the central surface on the isolation layer 109 is exposed. The capping nitride layer (not shown) and the spacer nitride layer (not shown) are then removed. It is thus possible to isolate the second silicon layer 110 in a distance of 0.1 um or less that is smaller than the design rule allowed by the etch apparatus. It is also possible to implement a cell having a space sufficiently enough to prevent a seam from being formed upon deposition of a silicide layer (not shown) used as a control gate.

Figure 1L:
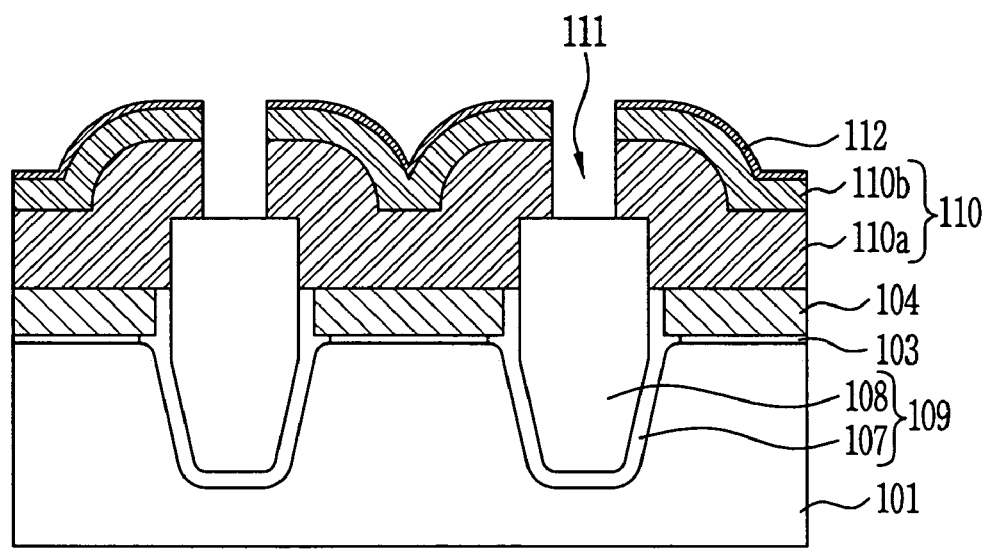

Referring to FIG. 1L, after the second silicon layer 110 is formed, in order to prevent a low dielectric oxide layer ($SiO_2$) from being formed at the interface of the second silicon layer 10, an anti-oxidization layer 112 can be formed on the surface of the second silicon layer 110, or the surface of the second silicon layer 110 can be formed using an anti-oxidization layer 112 as many as a predetermined thickness. In this case, the anti-oxidization layer 112 can be formed using a nitride material and the anti-oxidization layer 112 can be formed by a method, which will be described later.

Firstly, after the second silicon layer 10 is formed, the anti-oxidization layer 112 can be formed by nitrifying the surface of the second silicon layer 110 using plasma under a $NH_3$ atmosphere or $N_2/H_2$ atmosphere in-situ or ex-situ at a temperature of 200° C. to 500° C. for 1 to 10 minutes.

Secondly, the anti-oxidization layer 112 can be formed by performing an annealing process using the RTP under a $NH_3$ atmosphere at a temperature of 700° C. to 900° C.

Lastly, the anti-oxidization layer 112 can be formed by nitrifying the surface of the second silicon layer 10 using a furnace under a $NH_3$ atmosphere at a temperature of 550° C. to 800° C.

Meanwhile, in order to strip the native oxide layer on the surface of the second silicon layer 110, a pre-treatment cleaning process using HF or BOE can be performed before the anti-oxidization layer 111 is formed. It is preferred that a dielectric layer is then formed within 2 hours in order to prevent an additional native oxide layer from being formed.

Figure 1M:
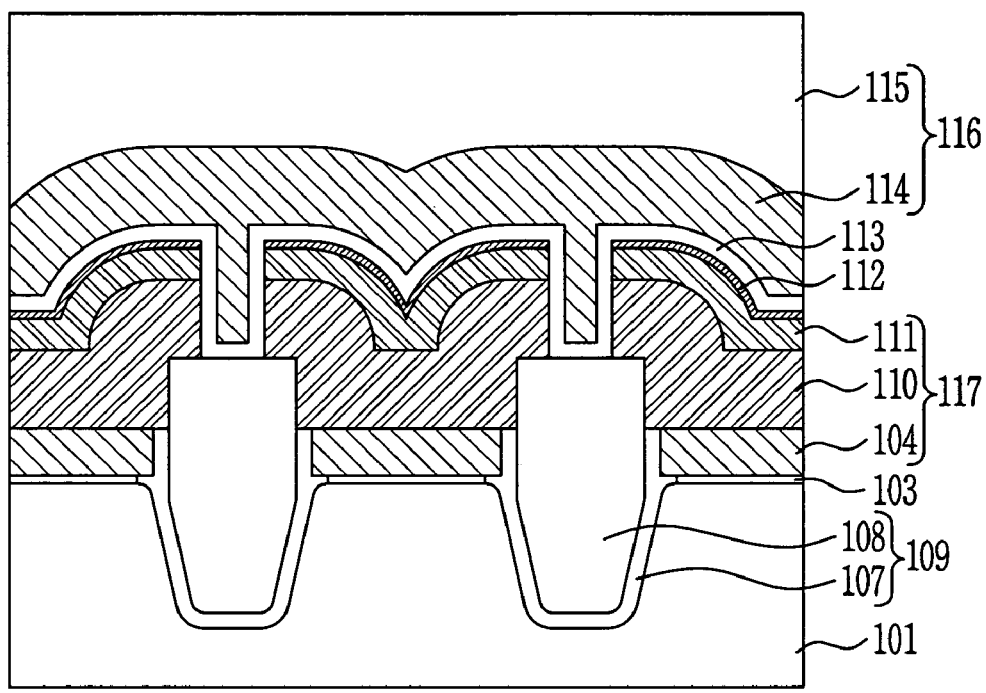

By reference to FIG. 1M, a dielectric layer 113, a third silicon layer 114 for a control gate and a silicide layer 115 are sequentially formed on the entire structure including the anti-oxidization layer 112.

In the above, the dielectric layer 113 can be formed to have an ONO structure in which a lower oxide layer ($SiO_2$), a silicon nitride layer ($Si_3N_4$) and an upper oxide layer ($SiO_2$) are sequentially stacked. Further, the silicide layer 115 can be formed using a tungsten silicide (WSix) layer.

At this time, the lower and upper oxide layers of the dielectric layer 113 can be formed using a HTO (Hot Temperature Oxide) layer that is formed using DCS ($SiH_2Cl_2$) and $N_2O$ gases of good pressure-resistant and TDDB (Time Dependent Dielectric Breakdown) properties as a source gas. The silicon nitride layer can be formed by means of the LP-CVD method using DCS($SiH_2Cl_2$) and $NH_3$ gases at a temperature of 650° C. to 800° C. and a low pressure of 1 to 3 Torr. In particular, the lower oxide layer is formed by depositing it at a temperature of 400° C. to 700° C. by means of a deposition apparatus and then performing the LP-CVD method at a temperature of 810° C. to 850° C. and a low pressure of 0.1 to 3 Torr. Meanwhile, during the process of forming the lower oxide layer, an impurity doped into the second silicon layer 10a is diffused into the third silicon layer 110b, so that the third silicon layer 110b also have conductivity.

Meanwhile, when the lower oxide layer being the first oxide layer of the dielectric layer is deposited, the semiconductor substrate is loaded into the boat at high temperature. In this case, oxidization occurs due to $O_2$ in the air. Accordingly, upon loading into the boat for depositing the lower oxide layer, if the boat loading temperature is set at a low temperature of room temperature to 300° C., it is possible to prevent oxidization by oxygen in the air. Such a measure can further prohibit oxidization of the second silicon layer 110 for the floating gate. It is therefore possible to further improve the electrical properties of the cell.

After the dielectric layer 113 is formed to have the ONO structure, a steam anneal process can be performed in the wet oxidization mode at a temperature of 750° C. to 800° C. in order to improve the interfacial characteristics among the layers. Meanwhile, the lower oxide layer, the silicon nitride layer and the upper oxide layer of the dielectric layer 113 are deposited in a thickness coincident with the device characteristic, wherein respective processes are performed with no time delay so that the layers are prevented from being contaminated by a native oxide layer or an impurity. It is preferred that the lower oxide layer is formed 35 Å to 60 Å in thickness, the silicon nitride layer is formed 50 Å to 65 Å in thickness and the upper oxide layer is formed 35 Å to 60 Å in thickness. Moreover, the steam anneal process is carried out so that an oxidization target thickness is 150 Å to 300 Å on a Si w/f (Monitoring wafer) basis.

The fourth silicon layer 114 for the control gate is formed using a doped polysilicon layer in thickness of 500 Å to 1000 Å at a temperature of 560° C. to 620° C. and a pressure of 0.1 Torr to 3 Torr. The silicide layer 115 is formed using a tungsten silicide layer, which has less stress by a subsequent annealing process while having fluorine, a good step coverage and a small sheet resistance (Rs), by supplying MS(SiH$_4$) or DCS(SiH$_2$Cl$_2$) having a good adhesive strength and WF$_6$ and then reacting them at a temperature of 300° C. to 500'. At this time, the tungsten silicide layer 115 is grown so that its stoichiometry is 2.0 to 2.8.

Thereafter, though not shown in the drawings, an anti-reflective layer (not shown) formed of SiOxNy or Si$_3$N$_4$ is formed on the silicide layer 115. The anti-reflective layer, the silicide layer 115, the fourth silicon layer 114 and the dielectric layer 113 are then patterned by means of an etch process using a control gate mask, thus forming a control gate 116 consisting of the fourth silicon layer 114 and the silicide layer 115. The first and second silicon layers 104 and 110 are then patterned by means of a self-aligned etch process using the patterned anti-reflective layer to form a floating gate 117 having the first and second silicon layers 104 and 110. Thereby, a flash memory cell is completed.

The present invention has the following effects.

1. Process steps can be reduced and the cost price can be saved because a pad oxidization process, a wall SAC oxidation process, a wall oxidation process and so on are omitted.

2. A rounding process can be more easily performed since the top edge of a trench is made rounded by a hydrogen anneal process.

3. A condition that an oxide layer is deposited thinner than a desired thickness at the top edge of a trench, can be prevented by a sidewall oxidation process. An active region as large as a desired critical dimension can be secured through a pre-treatment cleaning process performed before a liner oxide layer is deposited. Problems such as retention fail or fast erase in the device are improved to secure reliability.

4. Damage of an additional tunnel oxide layer is prevented to keep a uniform tunnel oxide layer within a channel region, which contributes to device characteristics.

5. Upon formation of the second silicon layer for polygate, the top of the second silicon layer is formed using an undoped silicon layer in an in-situ mode. It is thus possible to form a silicon layer having an oxidization-resistant property better than a doped silicon layer even with no additional process.

6. Before a first oxide layer (DCS-HTO) being a first thin layer of an ONO dielectric thin layer is deposited, an anti-oxidization layer is formed on the entire surface of a second silicon layer for a floating gate. It is thus possible to prevent the surface of the second silicon layer from being oxidized even in the process of loading the semiconductor substrate into a boat of high temperature in order to form the first oxide layer.

7. By forming the anti-oxidization layer, the second silicon layer can be prevented from being oxidized in a high-temperature wet annealing process of 750° C. or more that is performed in order to make the layer quality dense, remove pin-holes existing in the dielectric layer and increase the dielectric constant after the dielectric layer is formed. Furthermore, even in a high-temperature dry annealing process of 750° C. or more that is implemented in order to mitigate damage or stress generated on the gate sidewall after the gate is patterned, the interface of the second silicon layer and the dielectric layer can be prevented from being oxidized and an increase in a thickness of an effective oxide layer can be prevented.

8. Irregular oxidization of the second silicon layer for the floating gate not only lowers the dielectric constant but also generates weak points due to local oxidization. These weak points serve as the cause of the leakage current and lowers the breakout voltage. By solving these problems using the anti-oxidization layer, it is possible to prevent electrical properties of the cell from being degraded.

9. As mentioned above in addition to the above processes, loading of the semiconductor substrate into the boat when the first oxide layer of the dielectric layer is deposited is made at high temperature. At this time, oxidization occurs due to O$_2$ in the air. Therefore, if the boat loading temperature upon deposition of ONO-1 is lowered below 300° C., oxidization by oxygen in the air can be prevented. Such a measure can further prohibit oxidization of the second silicon layer for the floating gate. It is therefore possible to further improve electrical properties of the cell.

10. Existing apparatuses and processes can be used with no use of additional and complex processes and apparatuses. Devices with low cost and high reliability can be formed.

What is claimed is:

1. A method for manufacturing a flash memory device, comprising the steps of:
    forming a tunnel oxide layer on a semiconductor substrate;
    forming a first silicon layer on the tunnel oxide layer;
    forming a pad nitride layer on the first silicon layer;
    patterning the pad nitride layer, the first silicon layer and tunnel oxide layer to expose an isolation region of a semiconductor substrate;
    forming a trench in the isolation region;
    forming an insulating material layer on the layered substrate and then removing the insulating material layer on the pad nitride layer, thus forming an isolation layer in the trench;
    removing the pad nitride layer;
    forming a second silicon layer whose bottom is composed of a doped silicon layer and top is composed of an undoped silicon layer on the entire structure;
    patterning the second silicon layer so that a central portion of the isolation layer is exposed and the edge of the isolation layer is overlapped with the isolation layer;
    forming an anti-oxidization layer on the entire surface of the second silicon layer;
    sequentially forming a dielectric layer, a third silicon layer and a silicide layer on the entire structure including the second silicon layer; and
    patterning the silicide layer and the second silicon layer by means of an etch process using a control gate mask to form a control gate, and then patterning the first and second silicon layers by means of a self-aligned etch process to form a floating gate.

2. The method as claimed in claim 1, wherein the first silicon layer is composed of an undoped amorphous silicon layer or a polysilicon layer.

3. The method as claimed in claim 2, wherein the first silicon layer is formed by a low pressure chemical vapor deposition (LP-CVD) method using SiH$_4$ as a source gas at a temperature of 450° C. to 600° C. and a low pressure of 0.1 Torr to 3 Torr.

4. The method as claimed in claim 1, further comprising the steps of, before the insulating material layer is formed and after the trench is formed, implementing a hydrogen annealing process to make the top and bottom edges of the trench rounded;

implementing a cleaning process to strip the exposed side of the tunnel oxide layer as much as a target amount, while removing a native oxide layer formed on the sidewall and bottom of the trench, thus controlling a channel width; and forming a liner oxide layer composed of a HTO thin layer on the entire structure in order to protect the exposed side of the tunnel oxide layer.

5. The method as claimed in claim 3, wherein the hydrogen annealing process is performed in a rapid thermal mode at a temperature ranging from 600° C. to 1050° C. and a low pressure ranging from 50 Torr to 380 Torr, wherein hydrogen of 100 sccm to 2000 sccm is supplied.

6. The method as claimed in claim 1, wherein the doped silicon layer is formed by a LP-CVD method using $SiH_4$ or $Si_2H_6$ and a $PH_3$ gas at a temperature of 480° C. to 620° C. and a pressure of 0.1 to 3 Torr.

7. The method as claimed in claim 1, wherein the undoped silicon layer is formed using $SiH_4$ or $Si_2H_6$ and is formed by a LP-CVD method at a temperature of 510° C. to 550° C. and a pressure of 0.1 Torr to 3 Torr.

8. The method as claimed in claim 1, wherein the undoped silicon layer is formed in an in-situ mode wherein only an additive gas for doping an impurity is precluded without breaking vacuum in the same chamber, if the doped silicon layer is formed in a target thickness while the doped silicon layer is formed.

9. The method as claimed in claim 1, wherein the doped silicon layer is formed thicker than 4 to 9 times than the undoped silicon layer.

10. The method as claimed in claim 1, wherein the step of forming the second silicon layer comprises the steps of:

forming a capping nitride layer on the entire structure;

patterning the capping nitride layer so that the second silicon layer on the isolation layer is exposed;

forming a spacer nitride layer on a sidewall of the capping nitride layer on the exposed second silicon layer;

removing the second silicon layer in the exposed region; and removing the spacer nitride layer and the capping nitride layer.

11. The method as claimed in claim 1, wherein the anti-oxidization layer is formed using a nitride material.

12. The method as claimed in claim 1, wherein the anti-oxidization layer is formed by nitrifying the surface of the second silicon layer.

13. The method as claimed in claim 2, wherein the nitrification process comprises, after the second silicon layer is formed, nitrifying the surface of the second silicon layer in-situ or ex-situ by using plasma under a $NH_3$ atmosphere or $N_2/H_2$ atmosphere at a temperature of 200° C. to 500° C. for 1 to 10 minutes.

14. The method as claimed in claim 12, wherein the nitrification process is performed in a mode wherein annealing is performed under a $NH_3$ atmosphere at a temperature ranging from 700° C. to 900° C. by a rapid thermal process.

15. The method as claimed in claim 12, wherein the nitrification process is implemented in a furnace of a $NH_3$ atmosphere at a temperature of 550° C. to 800° C.

16. The method as claimed in claim 1, wherein when the semiconductor substrate is loaded into a boat in order to form the dielectric layer, a boat loading temperature is in range of room temperature to 300° C.

* * * * *